(12) United States Patent
Baek

(10) Patent No.: US 6,256,077 B1
(45) Date of Patent: Jul. 3, 2001

(54) THIN FILM TRANSISTOR ARRAY PANEL FOR A LIQUID CRYSTAL DISPLAY AND A METHOD FOR MANUFACTURING THE SAME USING FOUR PHOTOLITHOGRAPHY STEPS

(75) Inventor: Bum-Ki Baek, Kyungki-do (KR)

(73) Assignee: Samsung Electronics Co., Ltd.

( * ) Notice: Subject to any disclaimer, the term of this patent is extended or adjusted under 35 U.S.C. 154(b) by 0 days.

(21) Appl. No.: 09/425,050

(22) Filed: Oct. 22, 1999

(30) Foreign Application Priority Data

Nov. 26, 1998 (KR) .................................... 98-50885

(51) Int. Cl.[7] ..................... G02F 1/1343; G02F 1/136; G02F 1/1333
(52) U.S. Cl. .................. 349/43; 349/42; 349/46; 349/38; 349/39; 349/54; 438/30; 257/59
(58) Field of Search ................... 349/43, 42, 46, 349/38, 54, 39; 438/30; 257/59, 355

(56) References Cited

U.S. PATENT DOCUMENTS

| 5,019,002 | 5/1991 | Holmberg | 257/355 |
| 5,466,620 | 11/1995 | Bang | 438/30 |
| 5,834,328 | 11/1998 | Jang | 438/30 |
| 5,920,083 | 7/1999 | Bae | 257/59 |
| 5,994,155 | 11/1999 | Kim | 438/30 |
| 6,022,753 | 2/2000 | Park et al. | 438/30 |

FOREIGN PATENT DOCUMENTS

| 6-31053 | 6/1994 | (JP) | H01L/21/336 |

Primary Examiner—Kenneth Parker
Assistant Examiner—Julie Ngo
(74) Attorney, Agent, or Firm—Howrey Simon Arnold & White, LLP

(57) ABSTRACT

A gate wire including a gate line, a gate electrode and a gate pad is formed in the horizontal direction by a dry or wet etching method using a first mask. A gate insulating layer, an amorphous silicon layer, a doped amorphous silicon layer, and a data conductor layer are sequentially deposited and patterned by using a second mask to form a data wire and an etch protection layer located on the gate wire on each side of the data line. Subsequently, the doped amorphous silicon layer, which is not covered by the data wire and the etch protection layer, is etched. Next, a passivation layer is deposited and patterned along with the gate insulating layer and the semiconductor layer by using a third mask to form contact holes and an opening respectively exposing the drain electrode, the data pad, the gate pad, and the etch protection layer. After this step, an ITO layer is deposited and patterned by using a fourth mask to form a pixel electrode, a redundant gate pad and a redundant data pad, which are respectively connected to the contact hole. Next, the protection layer, the amorphous silicon layer and the doped amorphous silicon layer under the opening are sequentially etched until the gate insulating layer is exposed through the opening, thereby dividing the amorphous silicon layer under the two neighboring data lines without using an additional mask. At this time, it is preferable that an etchant is used that has a high etching selectivity between the gate insulating layer and the amorphous layer.

5 Claims, 9 Drawing Sheets

THIN FILM TRANSISTOR ARRAY PANEL FOR A LIQUID CRYSTAL DISPLAY AND A METHOD FOR MANUFACTURING THE SAME USING FOUR PHOTOLITHOGRAPHY STEPS

BACKGROUND OF THE INVENTION (a) Field of the Invention

The present invention relates to a thin film transistor (TFT) array panel for a liquid crystal display (LCD) and a method for manufacturing the same using four photolithography steps.

(b) Description of the Related Art

An LCD is one of the most widely used flat panel displays (FPDs). The LCD includes two panels having two kinds of electrodes for generating electric fields and a liquid crystal layer interposed between the two panels. The transmittance of incident light is controlled by the intensity of the electric field applied to the liquid crystal layer.

The field-generating electrodes are provided at both or one of the panels. One of the panels has at least one of the two types of electrodes includes switching elements such as thin film transistors.

In general, a TFT (thin film transistor) array panel of an LCD includes a plurality of pixel electrodes, and TFTs controlling signals supplied to the pixel electrodes. The TFT array panel is manufactured using a photolithography process using a plurality of photomasks. Five or six photolithography steps are used in producing a TFT array panel. Since the photolithography process is expensive and takes long, it is desirable to reduce the number of the photolithography steps. Even though manufacturing methods using only four photolithography steps have been suggested, these proposed methods are not easy to implement.

SUMMARY OF THE INVENTION

It is therefore an object of the present invention to provide a new method for manufacturing a thin film transistor array panel for a liquid crystal display using four photolithography steps.

It is another object of the present invention to reduce the leakage of current and to protect a signal line of a liquid crystal display.

These and other objects are provided, according to the present invention, by patterning a passivation layer, a gate insulating layer and a semiconductor layer in a single step, and by forming an etch protection layer on a gate line on both sides of a data line. Thus, the protection layer and the underlying semiconductor layer thereunder are etched to separate the semiconductor layer by the data line, taking advantage of the selective etching rate between the semiconductor layer and the etch protection rate.

According to the present invention, a gate wire including a gate line and gate electrodes connected to the gate line, is formed on an insulating substrate by a first photolithography process. Next, a gate insulating layer covering the gate wire, an amorphous silicon layer acting as a semiconductor layer, a doped amorphous silicon layer acting as an ohmic contact layer, and a data conductive layer are sequentially deposited on the insulating substrate. The data conductive layer and the doped amorphous silicon layer are patterned by a second photolithography process to form a data wire including a data line intersecting the gate line, a source electrode branched from the data line, and a drain electrode located opposite to the source electrode with respect to the gate electrode, an etch protection layer located on the gate line on both sides of the data line, and an underlying ohmic contact layer. A passivation layer is deposited on the data wire, the etch protection layer and the semiconductor layer, and patterned along with the semiconductor layer and the gate insulating layer by a third photolithography process to form an opening exposing the etch protection layer and a contact hole exposing the drain electrode. Subsequently, a conductive layer is deposited and patterned by a fourth photolithography process to form a pixel electrode connected to the drain electrode. Finally, a portion of the etch protection layer not covered by the passivation layer is etched, and the exposed amorphous silicon layer and the underlying doped amorphous silicon layer are removed.

BRIEF DESCRIPTION OF THE DRAWINGS

The accompanying drawings, which are incorporated in and constitute a part of the specification, illustrate an embodiment of the invention, and, together with the description, serve to explain the principles of the invention.

DETAILED DESCRIPTION OF THE PREFERRED EMBODIMENTS

Figure 1:
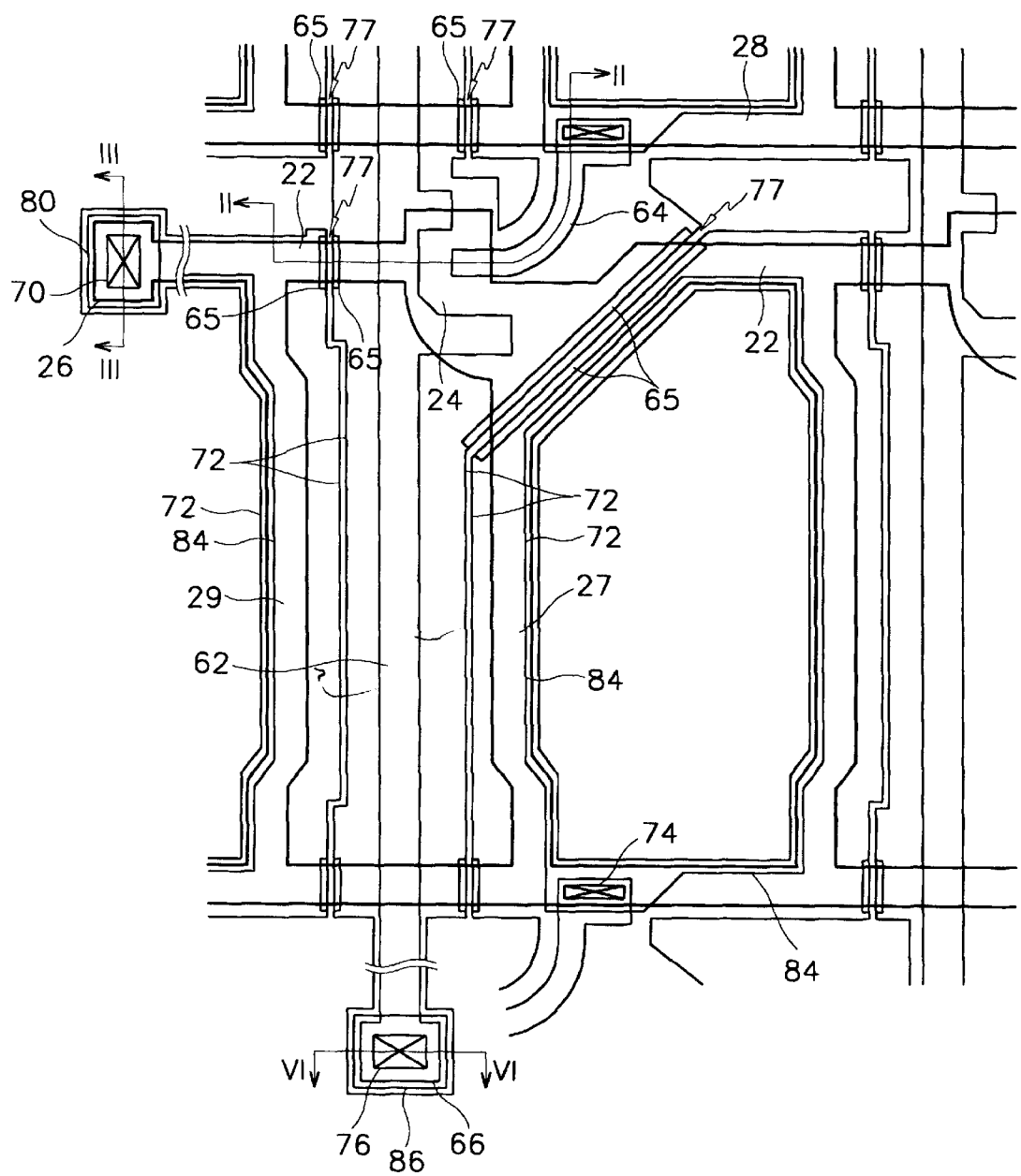
FIG. 1 is a layout view of a thin film transistor array panel for a liquid crystal display according to a preferred embodiment of the present invention.

The present invention now will be described more fully hereinafter with reference to the accompanying drawings, in which preferred embodiments of the invention are shown. This invention may, however, be embodied in many different forms and should not be construed as limited to the embodiments set forth herein. In the drawings, the thickness of layers and regions are exaggerated for clarity. Like numerals refer to like elements throughout. It will be understood that when an element such as a layer, region, or substrate is referred to as being "on" another element, it can be directly on the other element or intervening elements may also be present. In contrast, when an element is referred to as being "directly on" another element, there are no intervening elements present.

A structure of a thin film transistor array panel for a liquid crystal display according to an embodiment of the present invention will now be described with reference to the FIGS. 1 to 4.

Figure 2:
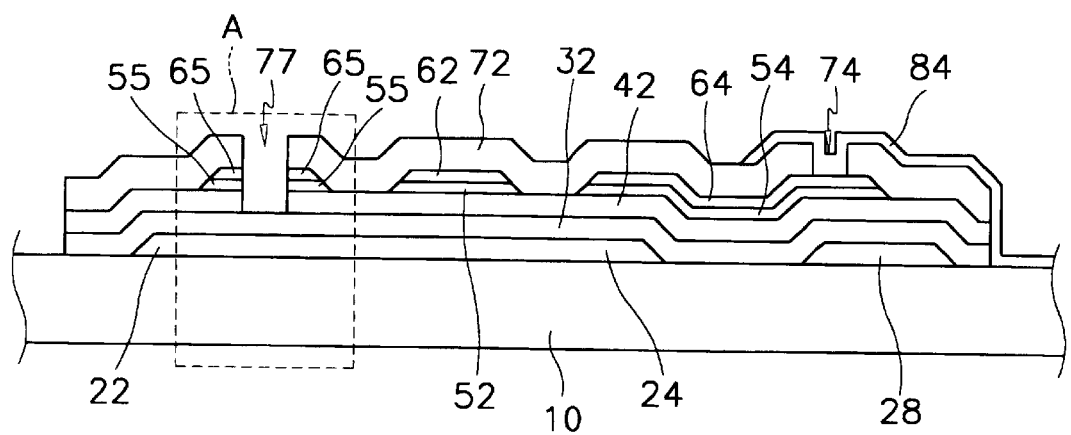
FIGS. 2 to 4 are cross-sectional views taken along lines II—II, III—III, and VI—VI of FIG. 1, respectively.
Figure 3:
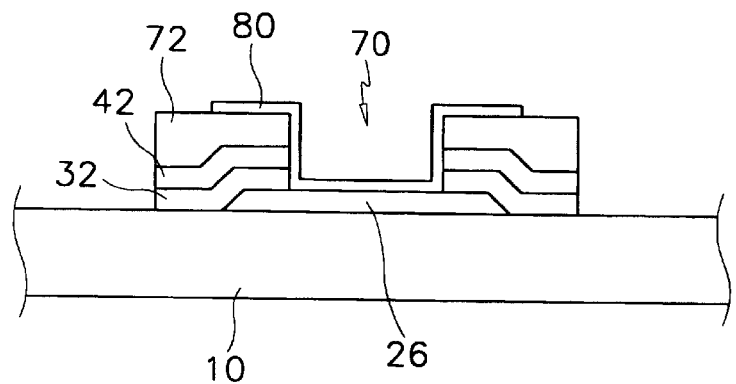
Figure 4:
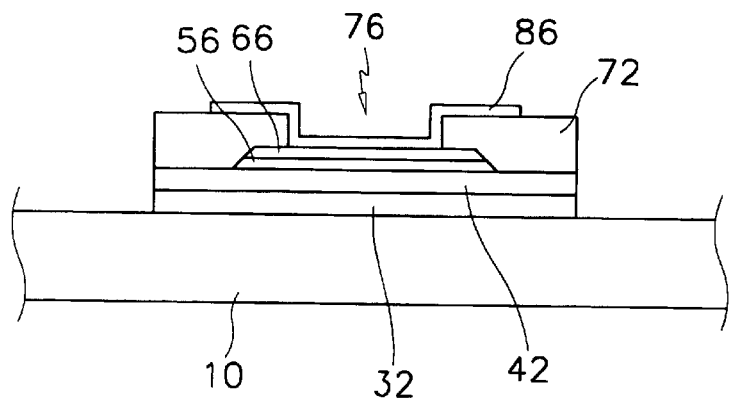

FIG. 1 is a layout view of a thin film transistor array panel for a liquid crystal display according to a preferred embodiment of the present invention, and FIGS. 2 to 4 are cross-sectional views respectively taken along lines II—II, III—III and IV—IV of FIG.1.

Gate wires and storage wires of metal or conductive material such as aluminum (Al) or aluminum alloy, molybdenum (Mo) or molybdenum-tungsten (MoW), chromium (Cr), and tantalum (Ta) are formed on an insulating substrate 10. Each gate wire includes a gate line (or scanning signal line) 22 extending in the horizontal direction in FIG. 1, a gate pad 26 connected to an end of the gate line 22 and transmitting a scanning signal from an external circuit to the gate line 22 and a gate electrode 24. Each storage wire includes a storage line 28 parallel with the gate line 22, and storage electrodes 27 and 29 extending in the vertical direction in FIG. 1 and connecting the gate wire 22, 24 and 26 to the storage line 28. The storage wire and the gate wire, along with a pixel electrode 84, which will be described hereinafter, provides a storage capacitance. The storage line 28 and the storage electrodes 27 and 29 may not be necessary, if the storage capacitance between the pixel electrode 84 and the gate line 22 and gate electrode 24 is sufficient.

The gate wire and the storage wire may have a multi-layered structure or a single-layered structure. When the gate wire and the storage wire are formed in a multi-layered structure, it is preferable that one layer is made of a material having a low resistivity and another layer is made of a material having a good contact with other materials. Double layers of Cr/Al (or Al alloy) and Al/Mo are examples of materials providing such properties.

A gate insulating layer 32 of silicon-nitride (SiNx) and a semiconductor pattern 42 made of a semiconductor material such as hydrogenated amorphous silicon are formed in a shape similar to the gate wire and the storage wire, and cover the gate wire and the storage wire.

An ohmic contact layer pattern 52, 54, 55 and 56 of a material such as n+ amorphous silicon doped with N-type impurities at a high concentration is formed on the semiconductor pattern 42. A data wire and an etch protection layer 65, which are made of conductive materials such as Mo or MoW, Cr, Al or Al alloy, and Ta, are formed on the ohmic contact layer pattern 52, 54, 55 and 56. The data wire includes a data line 62 extended in the vertical direction in FIG. 1 and intersecting the gate line 22 to define a pixel area. The data wire also has a source electrode of a thin film transistor branched from the data line 62, a data pad 66 connected to an end of the data line 62 and transmitting image signals from an external circuit to the data line 62, and a drain electrode 64 of the thin film transistor formed on an opposite side to the source electrode of the data line 62 with respect to the gate electrode 24. The etch protection layer 65 is located on the gate line 22 and the gate pad 26, and on the storage line 28 on both sides of the data line 62, and is divided into two portions by these elements.

The data wire and the etch protection layer 65 may have a multi-layered structure like the gate wire and the storage wire. Of course, when the data wire has a multi-layered structure, it is preferable that one layer is made of a material having a low resistivity and another is made of a material having a good contact with other materials.

The ohmic contact layer pattern 52, 54 and 56 reduces the contact resistance between the semiconductor layer 42 and the corresponding element of the data wire 62, 64, and 66, and has the same layout as the data wire.

A passivation layer 72 covering the data wire and the etch protection layer 65 is formed on the semiconductor layer 42. The passivation layer 72 has contact holes 74 and 76 respectively exposing the drain electrode 64 and the data pad 66, and a contact hole 70 exposing the gate pad 26 along with the gate insulating layer 30. The passivation layer 72 also has an opening 77 exposing the gate insulating layer 32 on the gate wire, as well as the storage line 28, along with the etch protection layer 65, and the ohmic contact layer 55. The passivation layer 72 can be made of an insulating material such as SiNx, acrylic organic material, other transparent photo-definable material, or other organic material. The semiconductor layer 42 is divided through the opening 77, and the passivation layer 72 has a shape similar to the gate wire, the storage wire, and the data wire. That is, a boundary of the passivation layer 72 is the same as that of the semiconductor layer 42 and the gate insulating layer 32. Also, the passivation layer 72 except for the contact holes 76, 74 and the opening 77, the semiconductor layer 42 except for the opening 77, and the gate insulating layer 32 all have the same shape.

The pixel electrode 84, which receives an image signal and generates an electric field with a common electrode of an upper panel, is formed on the insulating substrate 10 of the pixel area defined by the gate line 22 and the data line 62. The pixel electrode 84 is made of a transparent conductive material such as indium tin oxide (ITO), and is connected to the drain electrode 66 both physically and electrically through the contact hole 74. It receives image signals from the drain electrode 64. Even though the aperture ratio is increased when the pixel electrode 84 overlaps the gate wire, the storage wire or the data line 62, it is not necessary for the data wire and the gate wire to overlap the pixel electrode 84. A redundant gate pad 80 and a redundant data pad 86, respectively connected to the gate pad 26 and the data pad 66 through the contact holes 70 and 76, are formed on the gate pad 26 and the data pad 66, respectively. The redundant pads 80 and 86 are optional, because they protect the gate pad 26 and the data pad 66 from corrosion due to exposure to external air. The redundant gate pad 80 and data pad 86 also provide additional adhesiveness between an external circuit and the gate pad 26 and the data pad 66.

In this embodiment, although transparent ITO is used for the pixel electrode 84, it is possible to use an opaque conductive material in a reflective type liquid crystal display.

In this structure according to the embodiment, the semiconductor layer 42 is separated by the opening 77 as described above. It is separated to prevent forming a parasitic channel between the gate wire and/or the storage wire and the data wire other than the channel of thin film transistor, when the scanning signal is applied to the gate wire. If the semiconductor layer is not separated, a parasitic channel is formed and leaks currents. This ultimately interferes the signals between the two data lines. Accordingly, it is preferable that the semiconductor layer 42 between the two data lines 62 is separated.

A method for manufacturing a thin film transistor array panel according to a preferred embodiment of the present invention will now be described with reference to FIGS. 5A to 8B and FIGS. 1 to 4.

Figure 5A:
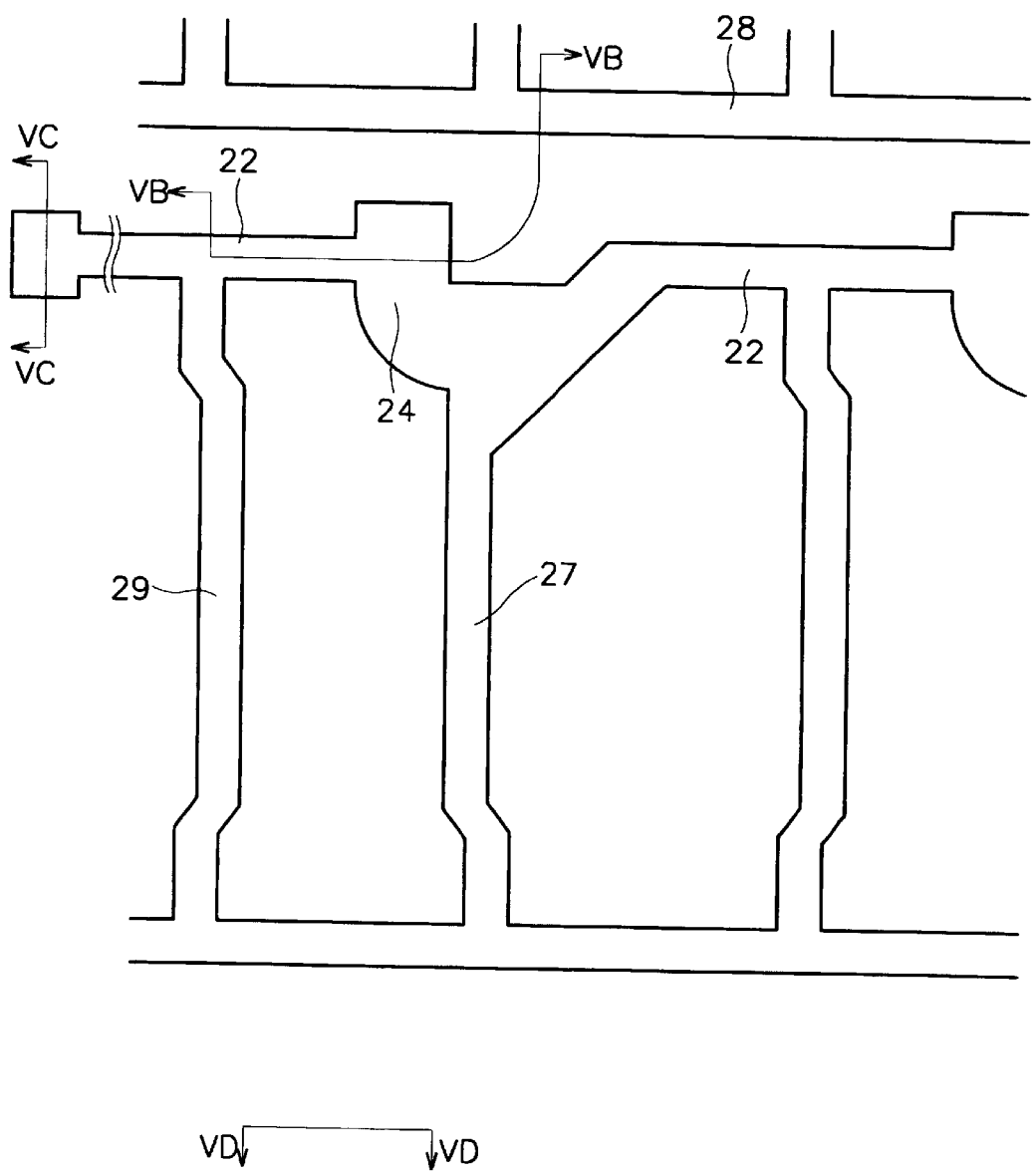
FIGS. 5A, 6A and 7A are layout views of the thin film transistor array panel showing in order a manufacturing method according to a preferred embodiment of the present invention.
Figure 5B:
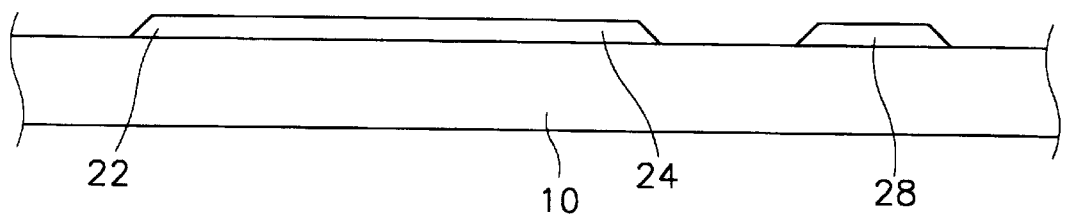
FIGS. 5B, 6B and 7B are cross-sectional views taken along lines VB—VB, VIB—VIB and VIIB—VIIB of FIGS. 5A, 6A and 7A, respectively.
Figure 5C:
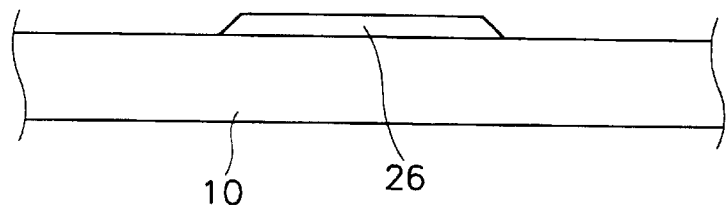
FIGS. 5C, 6C and 7C are cross-sectional views taken along lines VC—VC, VIC—VIC and VIIC—VIIC of FIGS. 5A, 6A and 7A, respectively.
Figure 5D:
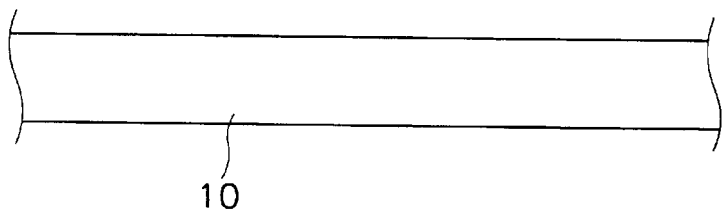
FIGS. 5D, 6D and 7D are cross-sectional views taken along lines VD—VD, VID—VID and VIID—VIID of FIGS. 5A, 6A and 7A, respectively.
Figure 6A:
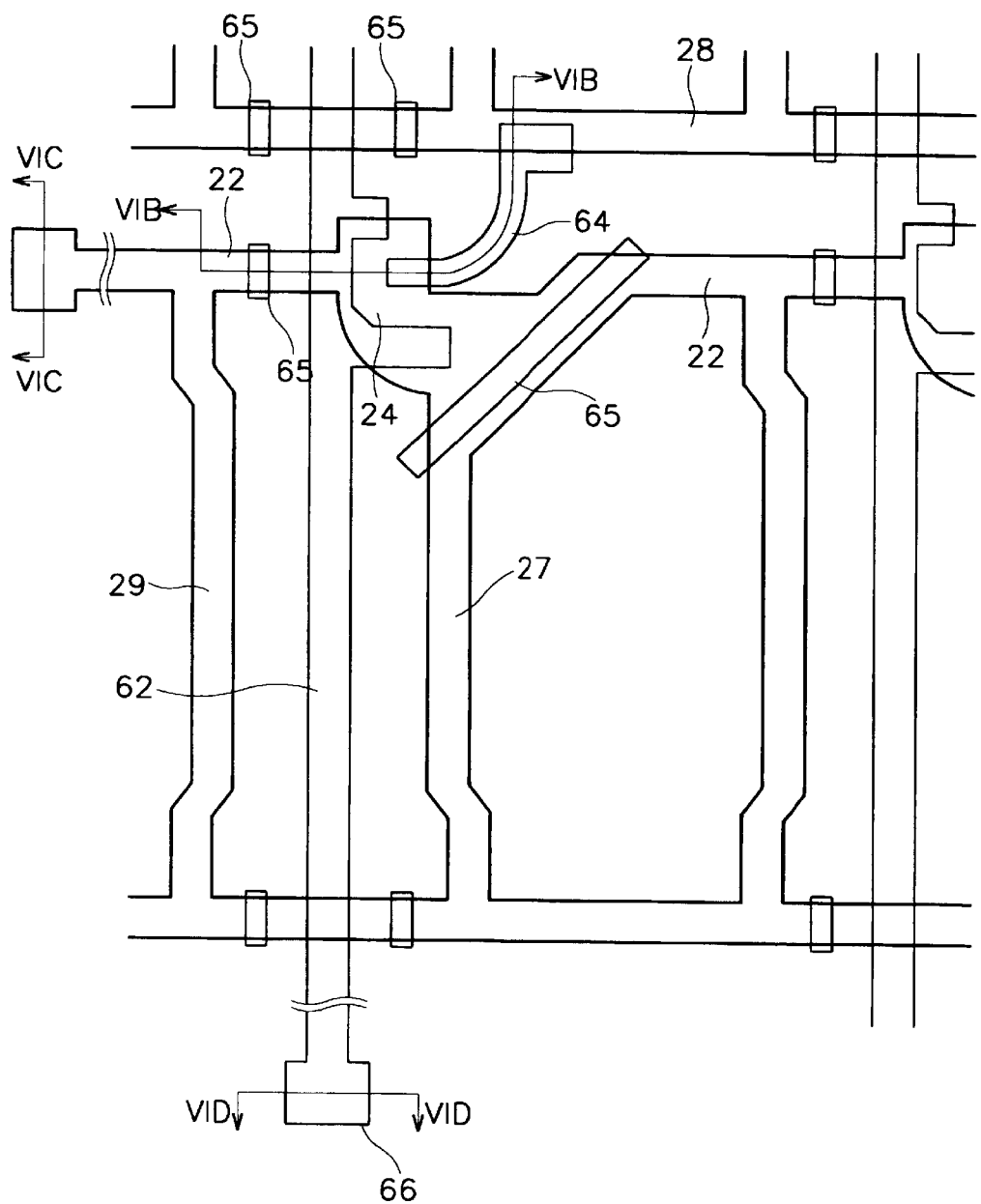
Figure 6B:
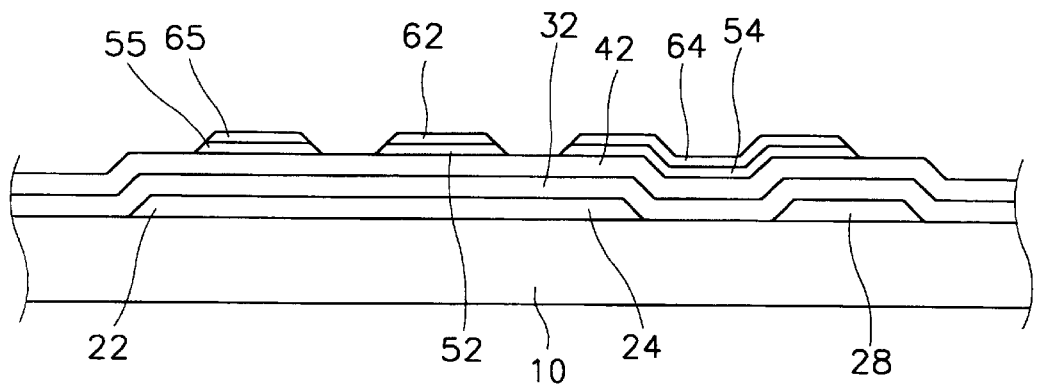
Figure 6C:
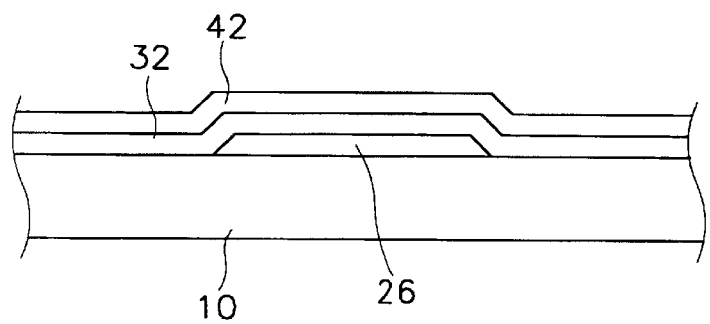
Figure 6D:
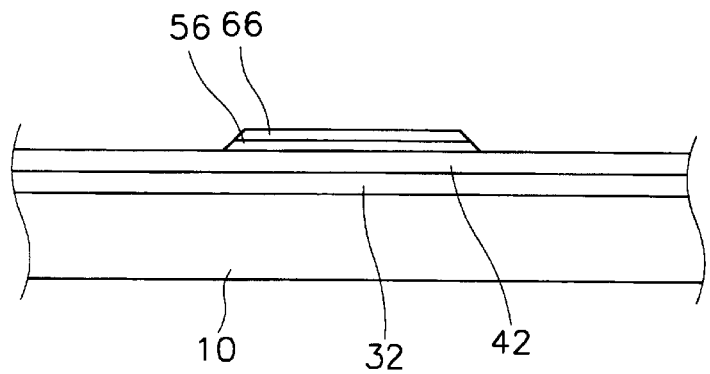
Figure 7A:
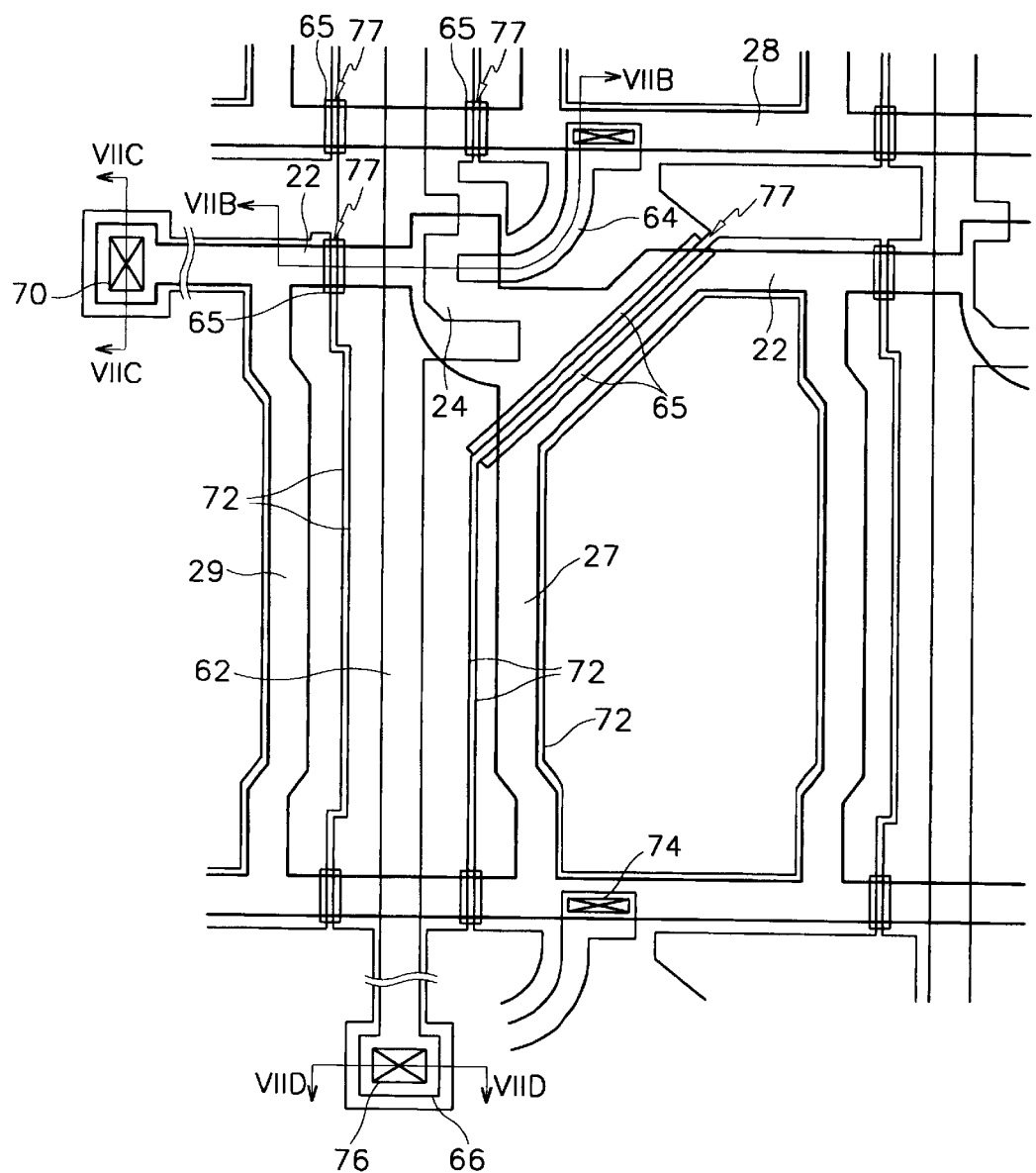
Figure 7B:
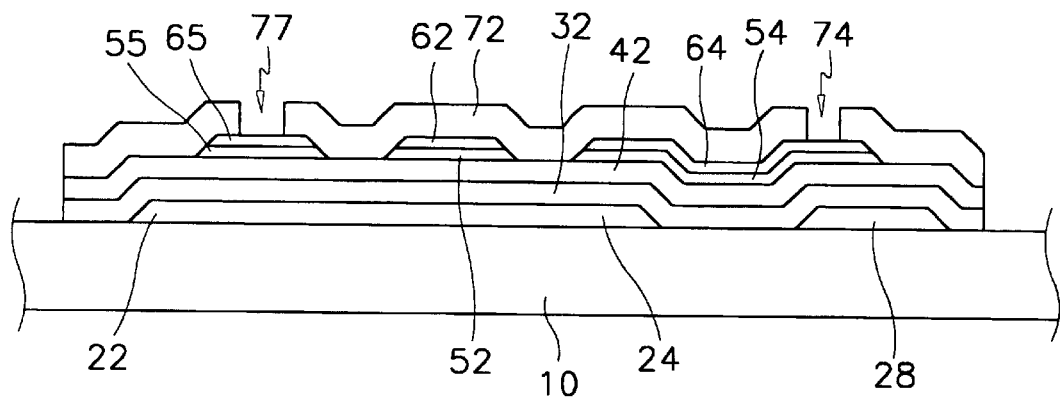
Figure 7C:
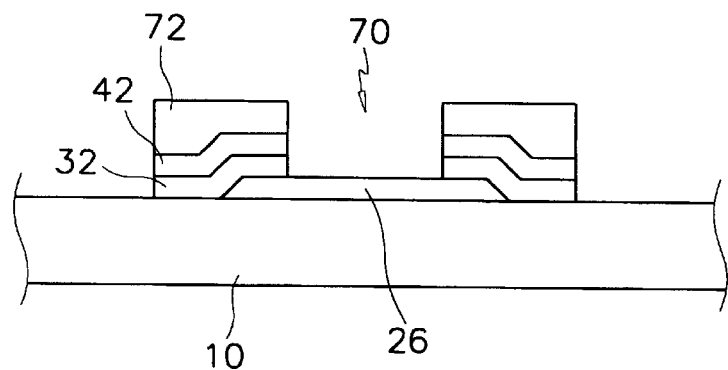
Figure 7D:
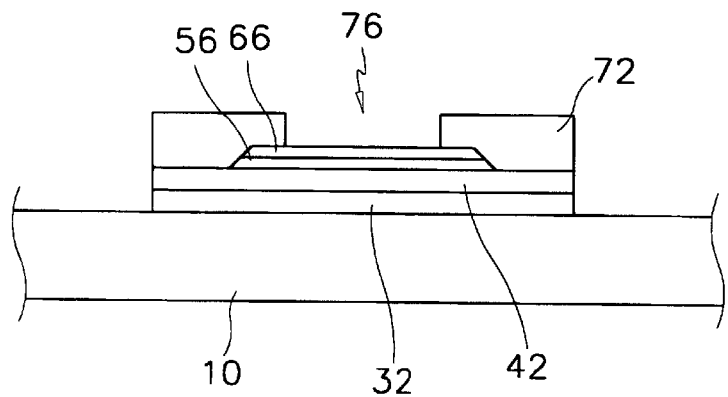
Figure 8A:
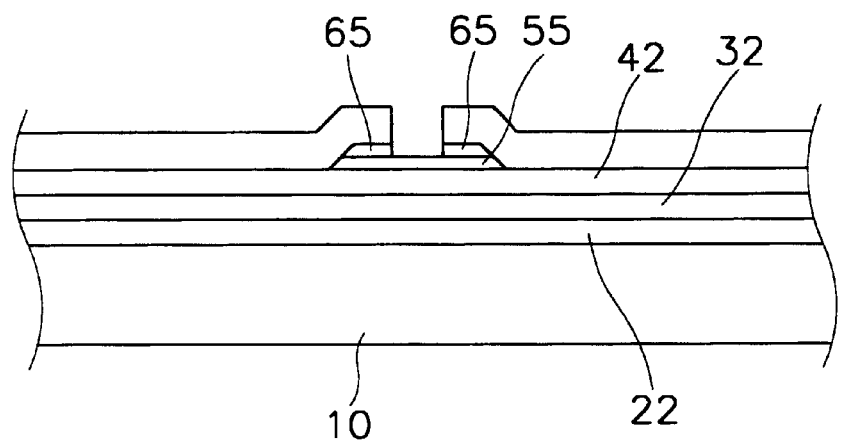
FIGS. 8A and 8B are cross-sectional views illustrating in detail the manufacturing method of portion A in FIG. 2.
Figure 8B:
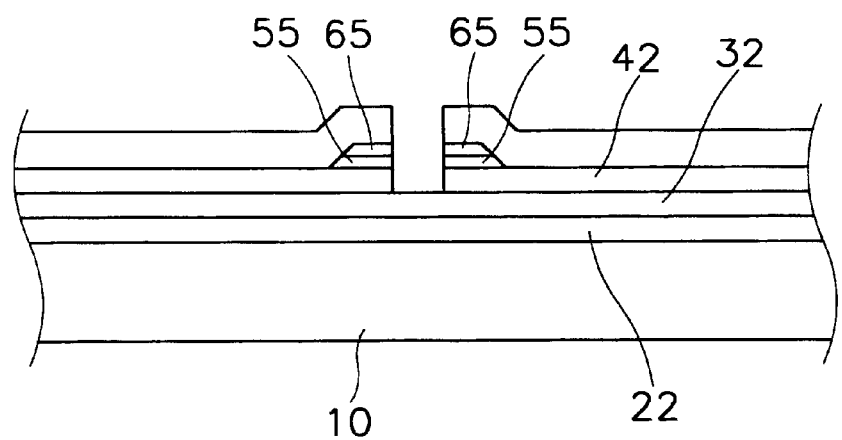

FIGS. 5A, 6A and 7A are layout views of the thin film transistor array panel showing in order the manufacturing steps according to the preferred embodiment of the present invention. FIGS. 5B, 6B and 7B are cross-sectional views taken along lines VB—VB, VIB—VIB and VIIB—VIIB of FIGS. 5A, 6A and 7A, respectively. FIGS. 5C, 6C and 7C are cross-sectional views taken along lines VC—VC, VIC—VIC and VIIC—VIIC of FIGS. 5A, 6A and 7A, respectively. FIGS. 5D, 6D and 7D are cross-sectional views taken along lines VD—VD, VID—VID and VIID—VIID of FIGS. 5A, 6A and 7A, respectively. FIGS. 8A and 8B are cross-sectional views illustrating in detail the method for manufacturing portion A in FIG. 2. First, as shown in FIGS. 5A to 5D, a conductive layer such as metal, is deposited on a substrate 10 by a method such as sputtering and patterned by a dry or wet etching method using a first mask to form a gate wire including a gate line 22, a gate electrode 24 and a gate pad 26 in the horizontal direction (in FIG. 5A), and a storage wire including a storage line 28 and storage electrodes 27 and 29. The storage line 28 extends in the horizontal direction, while the storage electrodes 27 and 29 extend in the vertical direction (in FIG. 5A) and connect the gate line 22 and the storage line 28. The gate wire and the storage wire may have a multi-layered structure or a single-layered structure. They are made of metal or conductive material such as aluminum (Al) or aluminum alloy, molybdenum (Mo) or molybdenum-tungsten (MoW), chromium (Cr), and tantalum (Ta).

Next, as shown in FIGS. 6A to 6D, a gate insulating layer 32, a semiconductor layer 42 made of amorphous silicon, and an amorphous silicon layer doped with N-type impurities are sequentially deposited by a method such as a chemical vapor deposition (CVD) method. Subsequently, a data conductor layer of metal such as aluminum (Al) or aluminum alloy, molybdenum (Mo) or molybdenum-tungsten (MoW), chromium (Cr), tantalum (Ta), and titanium (Ti) is deposited by a method such as sputtering. The data conductor layer is patterned by dry or wet etching using a second mask to form a data wire and an etch protection layer 65 located on the gate wire and the storage line 28 on both sides of the data line 62. Then, the doped ohmic contact layer, which is not covered by the data wire and the etch protection layer 65, is etched out without using a mask to form an ohmic contact layer 52, 54, 55 and 56 under the data wire and the etch protection layer 65. Next, as shown in FIGS. 7A to 7D, a passivation layer 72 is formed by CVD of silicon nitride or silicon oxide. After this step, contact holes 74, 76 and 70, and an opening 77 respectively exposing the drain electrode 64, the data pad 66, the gate pad 24, and the etch protection layer 65 are formed by etching the passivation layer 72 along with the gate insulating layer 32 and the semiconductor layer 42 at the same time using a third mask. At this time, the passivation layer 72, the semiconductor layer 42, and the gate insulating layer 32 are etched such that they all have a similar shape, and cover the gate wire, the storage wire, and the data wire as shown in FIGS. 7A to 7D. Here, though the passivation layer 72, the gate insulating layer 32 and the semiconductor layer 42 are etched at the same time, they are not entirely etched out. The semiconductor layer 42, the gate wire and the storage line 28 under the opening 77 of the passivation layer 72 are not etched because of the etch protection layer 65 under the opening 77.

At this time, the shape of a portion of the passivation layer 72 corresponding to the location of the contact holes 76 and 74 and the opening 77 is different from the shape of the gate insulating layer 32 and the semiconductor layer 42, while the shape of a remaining portion of the passivation layer 72 is identical to the shape of the gate insulating layer 32 and the semiconductor layer 42.

Furthermore, if the storage wire is provided in the preferred embodiment of the present invention, it is preferable that the opening 77 is extended to a portion between the data line 62 and the storage electrodes 27 and 29 to divide the semiconductor layer 42 under the data line 62, and the storage electrode 27 and 29 from each other as shown in FIG. 7A.

Here, if aluminum or aluminum alloy of the portion not covered by the passivation layer 72 is exposed, it is preferable that aluminum or aluminum alloy is removed through an etch process over the entire surface because aluminum or aluminum alloy has a bad contact with indium tin oxide (ITO) that will be deposited in a subsequent step. Therefore, when the gate wire, the storage wire, and the data wire have a multi-layered structure, it is preferable that a lower layer is made of a material having a low resistivity such as aluminum or aluminum alloy and an upper layer is made of a material having good contacting properties, such as chrome, molybdenum or molybdenum alloy. However, if the upper layer is made of aluminum or aluminum alloy and the lower layer of chrome, molybdenum or molybdenum alloy, it is preferable that the lower layer is exposed as described above.

Next, as shown in FIGS. 1 to 4, an ITO layer is deposited and patterned by using a fourth mask to form a pixel electrode 84, a redundant gate pad 80 and a redundant data pad 82, which are respectively connected to the contact holes 74, 70 and 76.

At this time, because the semiconductor layers 42 on the gate wire 22, 24 and 26, and the storage wire 28 between the two data lines 62 are connected to each other, if a scanning signal is applied to the gate wire 22, 24 and 26, a parasitic channel is generated on the gate wire and the storage line 28. Accordingly, the current leaks in the semiconductor layer 42 between the two data lines 62 which causes signal interferences between the two data lines 62. As a result, the semiconductor layer 42 on the gate wire and the storage wire 28 between the two data lines 62 must be separated. This is accomplished by first dividing the protection layer 65 to expose the ohmic contact layer 55 through the opening 77 without using an additional mask as shown in FIG. 8A. Next, the ohmic contact layer 55 and the semiconductor layer 42 are etched. The etch selectivity between the gate insulating layer 32 and the amorphous silicon layers 42 and 55 should be 10 or greater. In this way, the semiconductor layer 42 on the gate wire and the storage wire 28 between the two data lines 62 are separated and the gate insulating layer 32 is exposed through the opening 77. As shown, it is evident that this process can be done without using an additional mask.

On the other hand, the etch protection layer 65 may be made of material that can be etched by an ITO etchant. In this case, when forming the pixel electrode 84, the gate redundant pad 80 and the data redundant pad 82, the etch protection layer 65 is also removed, thereby exposing the ohmic contact layer 55 through the opening 77. Accordingly, the step removing the etch protection layer 65 may be omitted.

In this embodiment, the gate pad portion has a dual-layered structure including an upper layer made of ITO and a lower layer made of chrome, molybdenum or molybdenum alloy. A triple-layered structure may also be employed further comprising a conductive layer made of aluminum or aluminum alloy. Furthermore, by using the etch protection layer 65 and taking advantage of selective etching condition without using an additional mask, the semiconductor layer 42 on the gate wire 22, 24 and 26, and the storage wire 28 between the two data lines 62 can be separated through the opening 77. At the same time, the gate wire 22, 24 and 26, and the storage wire 28 may be protected by the gate insulating layer 32 remaining on those wires.

In the present invention, the process for manufacturing a thin film transistor panel for a liquid crystal display is effectively simplified, thereby minimizing overall product costs. Also, the separation of the semiconductor layers while leaving the gate insulating layer on the gate wire and the storage wire prevents the current leakage and protects the wires.

In the drawings and specification, there have been disclosed typical preferred embodiments of the present invention and, although specific terms are employed, they are used in a generic and descriptive sense only and not for purposes of limitation, the scope of the invention being set forth in the following claims.

What is claimed is:

1. A method for manufacturing a thin film transistor array panel, comprising the steps of:

forming a gate wire including a gate line and a gate electrode connected to the gate line on an insulating substrate by a first photolithography process;

depositing sequentially a gate insulating layer, a semiconductor layer, an ohmic contact layer, and a data conductive layer;

patterning the data conductive layer using a second photolithography process to form a data wire including a data line intersecting the gate line, a source electrode connected to the data line and adjacent to the gate electrode, and a drain electrode located opposite to the source electrode with respect to the gate electrode, and an etch protection layer located on the gate line on each side of the data line;

removing the ohmic contact layer pattern not covered by the data wire and the etch protection layer;

depositing a passivation layer on the data wire, the etch protection layer and the semiconductor layer;

patterning the passivation layer along with the semiconductor layer and the gate insulating layer by a third photolithography process and forming an opening exposing the etch protection layer, and a first contact hole exposing the drain electrode;

depositing a conductive layer;

patterning the conductive layer by a fourth photolithography process to form a pixel electrode connected to the drain electrode through the first contact hole;

etching the etch protection layer exposed through the opening to expose the ohmic contact layer under the etch protection layer; and removing the ohmic contact layer and the semiconductor layer under the opening to expose the gate insulating layer through the opening.

2. The method of claim 1, wherein the gate wire further includes a gate pad that is connected to and receives a signal from an external circuit, the data wire further includes a data pad that is connected to and receives a signal from an external circuit, and the passivation layer and the gate insulating layer have a second contact hole and a third contact hole respectively exposing the gate pad and the data pad, and wherein the method further comprises the step of forming a redundant gate pad and a redundant data pad formed on a same layer as the pixel electrode and respectively connected to the gate pad and the data pad through the second contact hole and the third contact hole.

3. The method of claim 2, wherein the gate wire has a single-layered, a dual-layered or a triple-layered structure made of a material selected from the group consisting of aluminum, aluminum alloy, chrome, tantalum, titanium, molybdenum and molybdenum alloy.

4. The method of claim 3, wherein if an upper layer of the dual-layered or the triple-layered structure is made of one material selected from the group consisting of aluminum and aluminum alloy, further comprising the step of removing the upper layer exposed through the first contact holes to the third contact holes.

5. A method for manufacturing a thin film transistor array panel, comprising the steps of:

forming a gate wire including a gate line and a gate electrode connected to the gate line on an insulating substrate by a first photolithography process;

depositing sequentially a gate insulating layer, a semiconductor layer, an ohmic contact layer, and a data conductive layer;

patterning the data conductive layer by a second photolithography process to form a data wire including a data line intersecting the gate line, a source electrode connected to the data line and located adjacent to the gate electrode, and a drain electrode located opposite to the source electrode with respect to the gate electrode, and an etch protection layer located on the gate line on each side of the data line;

removing the ohmic contact layer pattern not covered by the data wire and the etch protection layer;

depositing a passivation layer;

patterning the passivation layer along with the semiconductor layer and the gate insulating layer by a third photolithography process and forming an opening exposing the etch protection layer and a first contact hole exposing the drain electrode;

depositing a conductive layer;

patterning the conductive layer by a fourth photolithography process to form a pixel electrode connected to the drain electrode through the first contact hole, and, simultaneously, etching the etch protection layer exposed through the opening to expose the ohmic contact layer under the etch protection layer; and removing the ohmic contact layer and the semiconductor layer under the opening to expose the gate insulating layer through the opening, wherein the etch protection layer can be etched by the conductive layer etchant.

* * * * *